(12) United States Patent
Kavousian et al.

(10) Patent No.: US 9,160,584 B1
(45) Date of Patent: Oct. 13, 2015

(54) SPUR CANCELLATION USING AUXILIARY SYNTHESIZER

(71) Applicant: QUALCOMM Incorporated, San Diego, CA (US)

(72) Inventors: Amirpouya Kavousian, San Jose, CA (US); Yashar Rajavi, Mountain View, CA (US); Richard Tzewei Chang, Sunnyvale, CA (US); Alireza Khalili, Sunnyvale, CA (US); Mohammad Bagher Vahid Far, San Jose, CA (US); Abbas Komijani, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/603,127

(22) Filed: Jan. 22, 2015

(51) Int. Cl.
*H04L 25/08* (2006.01)
*H04L 25/03* (2006.01)
*H03F 3/19* (2006.01)

(52) U.S. Cl.
CPC *H04L 25/08* (2013.01); *H03F 3/19* (2013.01); *H04L 25/03* (2013.01); *H03F 2200/165* (2013.01)

(58) Field of Classification Search
CPC ......... H04L 25/08; H04L 25/03; H04L 1/205; H04L 1/0002; H04L 1/0054; H04L 1/20; H04L 2025/03363; H04L 2025/0349; H04L 2025/03509; H04L 25/03038; H04L 25/085; H03F 3/19; H03F 2200/165; H03F 1/32; H03F 2200/411; H03F 2200/451; H03F 2200/534; H03F 3/195; H03F 3/24; H03L 7/00; H03L 7/02; H03L 7/16; H04B 15/02; H04B 1/109

See application file for complete search history.

(56) References Cited

U.S. PATENT DOCUMENTS

| 7,965,134 | B2 | 6/2011 | Aparin et al. | |
|---|---|---|---|---|
| 8,331,485 | B2 | 12/2012 | Tang et al. | |
| 8,817,925 | B2 | 8/2014 | Husted et al. | |
| 2006/0008017 | A1* | 1/2006 | Balakrishnan et al. | 375/260 |
| 2006/0093019 | A1* | 5/2006 | Gaikwad et al. | 375/139 |
| 2007/0153878 | A1* | 7/2007 | Filipovic | 375/147 |
| 2007/0202830 | A1* | 8/2007 | Muhammad et al. | 455/298 |
| 2009/0160564 | A1* | 6/2009 | Cho et al. | 331/1 A |
| 2010/0040184 | A1* | 2/2010 | Haralabidis et al. | 375/373 |
| 2010/0266000 | A1* | 10/2010 | Froimovich et al. | 375/222 |
| 2011/0007839 | A1* | 1/2011 | Tang et al. | 375/296 |
| 2011/0199142 | A1 | 8/2011 | Mu | |

(Continued)

OTHER PUBLICATIONS

All Digital Compensato scheme for Spur Induced Transmit self-jamming in Multi Receiver RF Front-Ends; Omer et al.; IEEE 2012; 3 pages.*

*Primary Examiner* — Hirdepal Singh
(74) *Attorney, Agent, or Firm* — Mahamedi Paradice LLP

(57) ABSTRACT

A method and apparatus are disclosed for mitigating a frequency spur included with a transmitter output signal from a wireless device. For at least some embodiments, the wireless device may include an auxiliary synthesizer to generate a spur cancellation signal to be summed with the transmitter output signal to cancel or reduce the frequency spur. The auxiliary synthesizer may also generate an auxiliary clock signal to demodulate a received communication signal. In some embodiments, the transmitter output signal may be looped back to a receiver of the wireless device to determine whether the frequency spur is reduced below a threshold. Data from the receiver may be used to modify the spur cancellation signal.

22 Claims, 5 Drawing Sheets

(56) References Cited

U.S. PATENT DOCUMENTS

| | | | |
|---|---|---|---|
| 2012/0154031 A1* | 6/2012 | Zuckerman | 327/551 |
| 2012/0295557 A1* | 11/2012 | Brunel et al. | 455/78 |
| 2013/0101068 A1* | 4/2013 | Mombers et al. | 375/316 |
| 2013/0115903 A1* | 5/2013 | Kroeger et al. | 455/193.1 |
| 2013/0208826 A1* | 8/2013 | Asuri et al. | 375/296 |
| 2013/0271186 A1 | 10/2013 | Hossain et al. | |
| 2014/0184342 A1 | 7/2014 | Chang et al. | |
| 2014/0355459 A1* | 12/2014 | Rafique | 370/252 |

* cited by examiner

SPUR CANCELLATION USING AUXILIARY SYNTHESIZER

TECHNICAL FIELD

The example embodiments relate generally to wireless devices, and specifically to cancelling a frequency spur using an auxiliary synthesizer in a wireless device.

BACKGROUND OF RELATED ART

Wireless devices may communicate with other devices using multiple technologies, including wireless local area network (WLAN) signals (e.g., 900 MHz, 2.4 GHz, 5 GHz, and 60 GHz signaling), BLUETOOTH® (BT or Bluetooth) signals, near field communication (NFC) signals and cellular signals such as long term evolution (LTE) signals. For example, a wireless device may transmit a communication signal through a transmitter to other devices and may receive a communication signal from other devices through a receiver.

Some transmitted communication signals may include one or more undesired signal components. These signal components may be undesired harmonics of clock signals present within the transmitter. These undesired harmonics are often referred to as frequency spurs. If the amplitude of a frequency spur is large enough, the wireless device may fail regulatory performance requirements or may interfere with other nearby devices.

Thus, there is a need to reduce frequency spurs within a communication signal transmitted by the wireless device.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A method and apparatus are disclosed that may mitigate a frequency spur included in a transmitter output signal from a wireless device. In accordance with the example embodiments, a transceiver may include a transmitter to generate the transmitter output signal based on a digital-to-analog converter (DAC) clock signal, circuitry to generate a spur cancellation signal during a first mode based on the DAC clock signal, and a summing node, coupled to the transmitter and the circuitry, to sum the spur cancellation signal with the transmitter output signal to cancel, at least in part, a frequency spur included with the transmitter output signal. In some embodiments, the transceiver may include a receiver to demodulate a received communication signal based on an auxiliary clock signal, different from the spur cancellation signal, provided by the circuitry during a second mode.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

The example embodiments are described below in the context of Wi-Fi enabled devices for simplicity only. It is to be understood that the example embodiments are equally applicable for devices using signals of other various wireless standards or protocols. As used herein, the terms "wireless local area network (WLAN)" and "Wi-Fi" can include communications governed by the IEEE 802.11 standards, BLUETOOTH®, HiperLAN (a set of wireless standards, comparable to the IEEE 802.11 standards, used primarily in Europe), and other technologies used in wireless communications.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature is set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
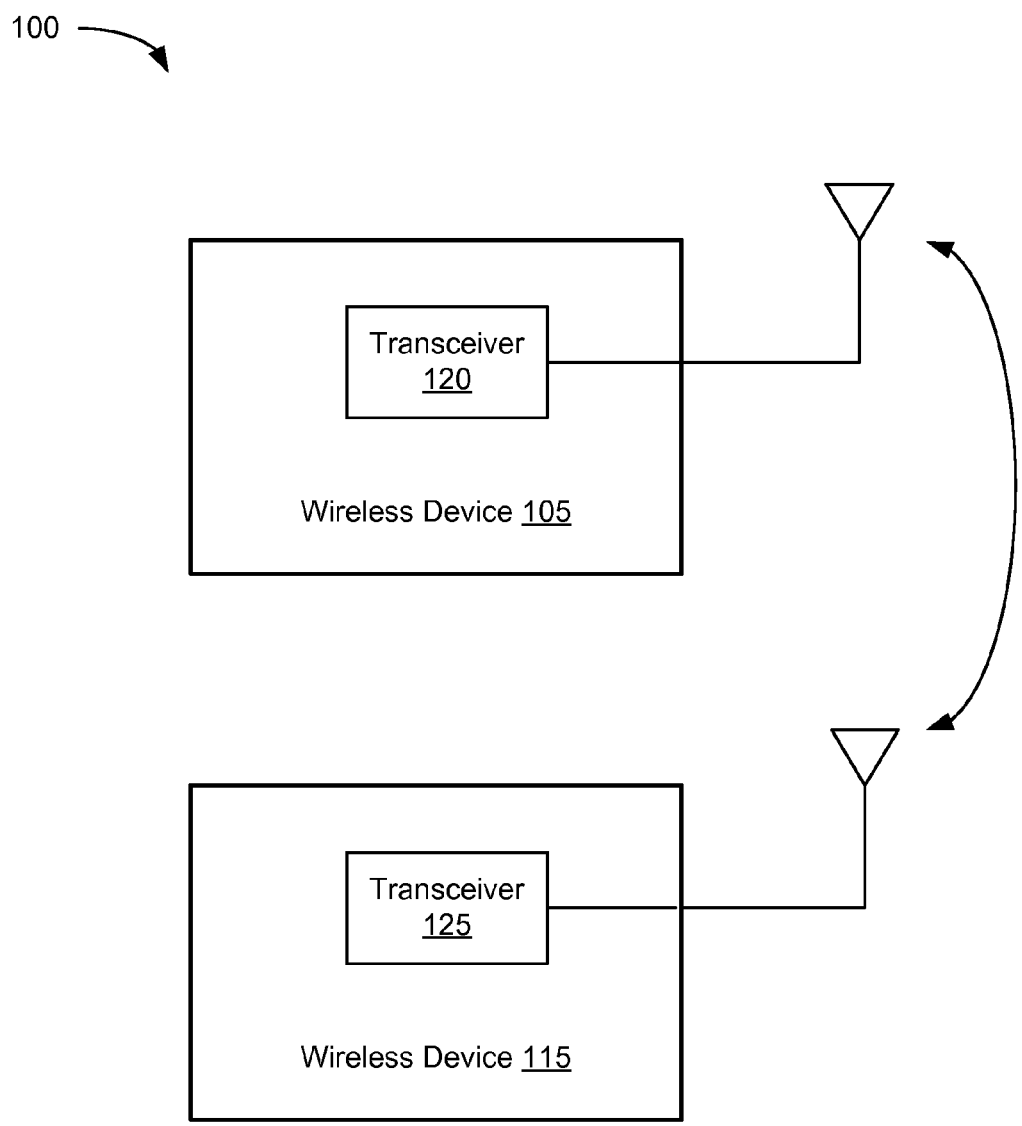
FIG. 1 depicts an example wireless system within which the example embodiments may be implemented.

FIG. 1 depicts an example wireless system 100 within which the example embodiments may be implemented. Wireless system 100 is shown to include a first wireless device 105 and a second wireless device 115. Although only two wireless devices 105 and 115 are shown for simplicity, it is to be understood that wireless system 100 may include any number of wireless devices. First wireless device 105 may include a first transceiver 120 and second wireless device 115 may include a second transceiver 125. First wireless device 105 may communicate with second wireless device 115. Thus, first wireless device 105 may use first transceiver 120 to transmit and receive communication signals to and from second transceiver 125 of second wireless device 115. Communication signals may be a Wi-Fi signal according to the IEEE 802.11 specification, a BLUETOOTH signal according to a specification from the Bluetooth Special Interest Group, a cellular signal according to GSM, UMTS or LTE specifications, or any other technically feasible communication signal.

Figure 2:
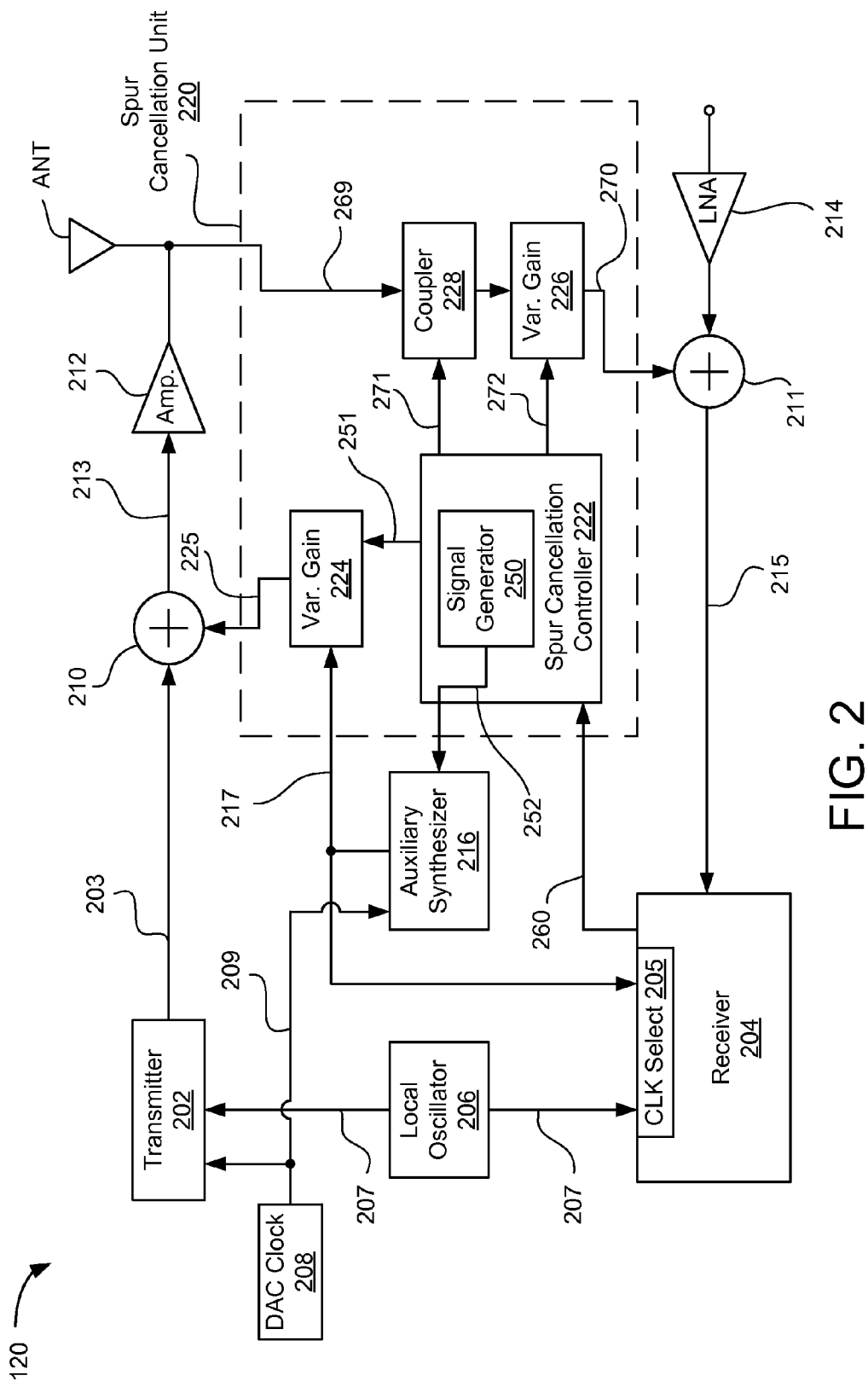
FIG. 2 shows a block diagram of one embodiment of a transceiver of FIG. 1.

FIG. 2 shows a block diagram of one embodiment of first transceiver 120 of FIG. 1. First transceiver 120 may transmit and receive communication signals to and from other transceivers (not shown for simplicity). First transceiver 120 may include a transmitter 202, a receiver 204, a local oscillator 206, a digital-to-analog converter (DAC) clock 208, a first summing node 210, a second summing node 211, an amplifier 212, a low noise amplifier (LNA) 214, an auxiliary synthesizer 216, and a spur cancellation unit 220. Transmitter 202 may receive a DAC clock signal 209 from DAC clock 208 and receive a local oscillator (LO) signal 207 from local oscillator 206. Transmitter 202 may generate a transmitter output signal 203 based, at least in part, on DAC clock signal 209 and LO signal 207. For example, digital data may be converted to an analog signal via a DAC (within transmitter 202, not shown for simplicity) clocked by DAC clock signal 209. The analog signal may then be modulated by LO signal 207 within transmitter 202 to generate transmitter output signal 203. Transmitter output signal 203 may be provided to amplifier 212 via first summing node 210. First summing node 210 may sum transmitter output signal 203 with a cancelling signal 225 (described in more detail below in conjunction with spur cancellation unit 220) to generate a spur-compensated output signal 213. In some embodiments, amplifier 212 may be a power amplifier to amplify and transmit spur-compensated output signal 213 to other devices via antenna (ANT).

A communication signal may also be received by first transceiver 120. For example, LNA 214 may receive a communication signal via an antenna (not shown for simplicity) and provide the amplified communication signal to second summing node 211. For some embodiments, LNA 214 may be couple to antenna ANT. Second summing node 211 may sum the output signal from LNA 214 with a signal from spur cancellation unit 220 (described in more detail below in conjunction with spur cancellation unit 220) to generate a received communication signal 215 for receiver 204. In some embodiments, receiver 204 may include a clock select unit 205 to select either LO signal 207 or an auxiliary output signal 217 generated by auxiliary synthesizer 216 to demodulate received communication signal 215.

In some embodiments, auxiliary synthesizer 216 may be a simplified, less accurate clock synthesizer (e.g., as compared to local oscillator 206). Therefore, in some embodiments, auxiliary output signal 217 may be similar in frequency to LO signal 207. However, phase noise, jitter, and/or other clock quality measurements of auxiliary output signal 217 may be relatively lower than similar quality measurements of LO signal 207. Thus, auxiliary output signal 217 may perform as an auxiliary clock signal to demodulate received communication signals 215 that do not require a clock signal with one or more relatively high clock quality measurements. For example, receiver 204 may select auxiliary output signal 217 when receiving a delivery traffic indication message (DTIM) packet as specified by the IEEE 802.11 specification. DTIM packets may be transmitted at the lowest basic modulation and coding scheme (MCS) rate which may not require a relatively precise (e.g., high quality) clock signal. Conversely, receiver 204 may select LO signal 207 to receive data packets from another device via LNA 214 and its associated antenna. Receiving data packets may require a relatively precise clock signal to demodulate received communication signals 215 transmitted at relatively high MCS rates.

An unwanted frequency spur may be included with transmitter output signal 203. For example, the DAC within transmitter 202 may receive DAC clock signal 209. A harmonic of DAC clock signal 209 may be unintentionally coupled onto transmitter output signal 203 and become the unwanted frequency spur. In some embodiments, auxiliary synthesizer 216 (not typically used when first transceiver 120 transmits a communication signal) may be used to generate a spur cancellation signal (e.g., generate an auxiliary output signal 217 that may be used to mitigate and/or cancel the frequency spur).

Auxiliary synthesizer 216 may receive DAC clock signal 209 to generate auxiliary output signal 217. Thus, auxiliary output signal 217 may be based, at least in part, on DAC clock signal 209. Since the frequency spur may also be based on DAC clock signal 209, any variations in DAC clock signal 209 that may change the frequency spur may be tracked by auxiliary output signal 217. Accordingly, auxiliary synthesizer 216 may be configured to generate auxiliary output signal 217 for use as the spur cancellation signal to track the DAC clock signal 209, and thereafter cancel the frequency spur via summing node 210.

Spur cancellation unit 220 (shown by dashed lines in FIG. 2) may include a spur cancellation controller 222, a first variable gain amplifier 224, a second variable gain amplifier 226, and a coupler 228. In some embodiments, spur cancellation controller 222 may include a signal generator 250 to generate a mode control signal 252 for use by auxiliary synthesizer 216. In a first mode, mode control signal 252 may configure auxiliary synthesizer 216 to generate the spur cancellation signal via auxiliary output signal 217 for use by spur cancellation unit 220. For example, during the first mode, auxiliary synthesizer 216 may generate the spur cancellation signal to have similar characteristics (e.g., frequency, amplitude) as the frequency spur for use by spur cancellation unit 220. In a second mode, mode control signal 252 may configure auxiliary synthesizer 216 to generate auxiliary output signal 217 for use as the auxiliary clock signal for receiver 204. For example, during the second mode, receiver 204 may use the auxiliary clock signal to receive a communication signal.

Auxiliary output signal 217 (when used as the spur cancellation signal) may be received by first variable gain amplifier 224. Spur cancellation controller 222 may control first variable gain amplifier 224 via first variable gain amplifier control signal 251 to adjust a phase and/or gain of auxiliary output signal 217 to generate cancelling signal 225. For example, first variable gain amplifier 224 may generate cancelling signal 225 with an in-phase (I) signal and a quadrature (Q) signal that may have an opposite amplitude and phase with respect to the frequency spur included within transmitter output signal 203. Cancelling signal 225 may be summed with transmitter output signal 203 via first summing node 210. In some embodiments, first summing node 210 may be a current summing node. Therefore, a current signal associated with transmitter output signal 203 may be added to current signals provided by first variable gain amplifier 224 to generate spur-compensated output signal 213. Operation of first variable gain amplifier 224 is described in more detail below in conjunction with FIG. 3.

In some embodiments, spur cancellation unit 220 may receive information 260 from receiver 204 to assist in generating cancelling signal 225. For example, an amplifier output signal 269 may be looped back (via a loopback signal 270) to receiver 204. Receiver 204 may analyze loopback signal 270 and determine if a frequency spur is present in loopback signal 270, or determine if a magnitude of a frequency spur is greater than a threshold. If the frequency spur is present in loopback signal 270, or if the magnitude of the frequency spur is greater than the threshold, then spur cancellation controller 222 may determine one or more new or updated settings for auxiliary synthesizer 216 and/or first variable gain amplifier 224 to dynamically adjust one or more characteristics of cancelling signal 225, as desired.

Spur cancellation controller 222 may control coupler 228 via coupler control signal 271 and may control second variable gain amplifier 226 via second variable gain amplifier control signal 272. Spur cancellation controller 222 may cause coupler 228 and second variable gain amplifier 226 to provide loopback signal 270 to receiver 204. For example, during a loopback operation, coupler 228 may receive amplifier output signal 269. In some embodiments, coupler 228 may include a signal attenuator (not shown for simplicity) to reduce a signal magnitude, for example, when amplifier 212 is a power amplifier. Coupler 228 is coupled to second variable gain amplifier 226. Second variable gain amplifier 226 may provide fine gain control of a signal from coupler 228 before the signal is received by second summing node 211. In some embodiments, during loopback operation, output signals from LNA 214 may be set to zero. Thus, receiver 204 may receive and analyze loopback signal 270 (e.g., a gain adjusted amplifier output signal 269). In some embodiments, receiver 204 may perform a Fast Fourier Transform (FFT) operation on loopback signal 270 to determine if a frequency spur is present within loopback signal 270 or to compare the magnitude of the frequency spur to a threshold. Thus, based on information 260 received from receiver 204, spur cancellation controller 222 may adjust auxiliary synthesizer 216 and/or first variable gain amplifier 224 to increase the ability of cancelling signal 225 to reduce or eliminate the frequency spur.

In some embodiments, spur cancellation controller 222 may initially configure auxiliary synthesizer 216 and/or first variable gain amplifier 224 using initial values determined during a previous test procedure, and stored in a memory. For example, first wireless device 105 may be characterized during a factory test procedure, and initial settings of auxiliary synthesizer 216 and/or first variable gain amplifier 224 may be determined, and stored in a memory. In another example, operation of first wireless device 105 may be simulated and initial settings of auxiliary synthesizer 216 and/or first variable gain amplifier 224 may be determined based on the simulation, and stored in a memory.

Figure 3:
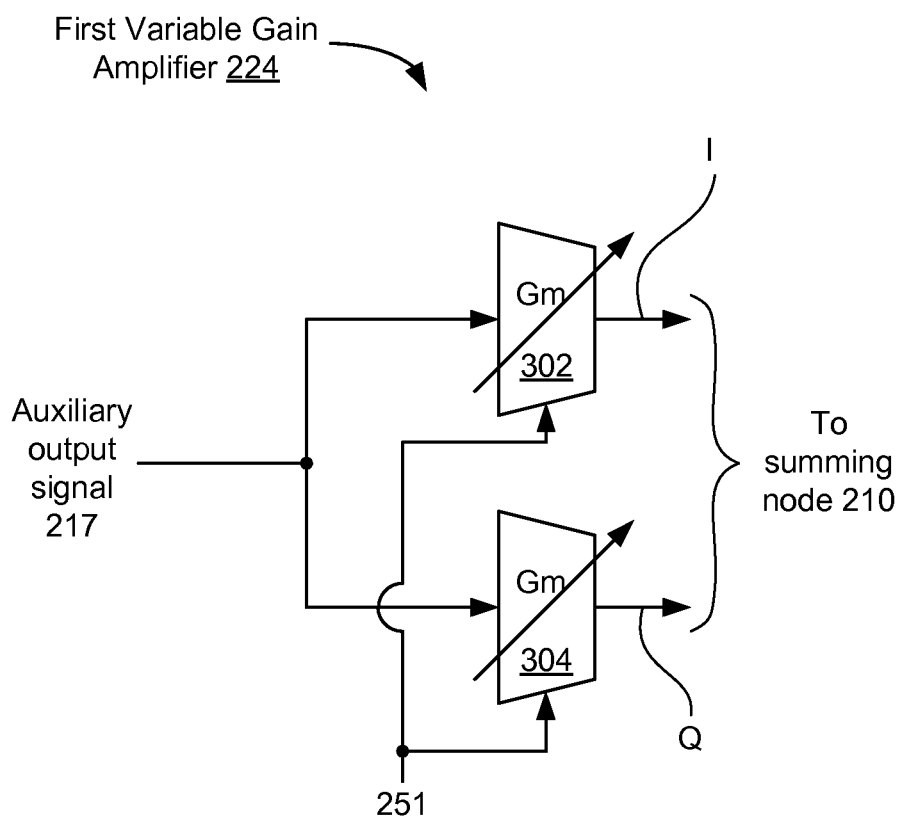
FIG. 3 shows a block diagram of a variable gain amplifier in accordance with some embodiments.

FIG. 3 shows a block diagram of first variable gain amplifier 224 in accordance with some embodiments. First variable gain amplifier 224 may include a first transconductance amplifier 302 and a second transconductance amplifier 304. First transconductance amplifier 302 and second transconductance amplifier 304 may receive auxiliary output signal 217 (e.g., a voltage signal) and provide a current signal with varying amounts of gain, controlled by first variable gain amplifier control signal 251. In some embodiments, the first transconductance amplifier 302 and the second transconductance amplifier 304 may provide I (in-phase) and Q (quadrature) signals to first summing node 210. For example, when auxiliary output signal 217 is described by $A\cos(\omega t+\theta)$, the output of the first transconductance amplifier 302 and the second transconductance amplifier 304 may be described by eq. 1, shown below:

$$A\cos(\omega t+\theta)=A\cos(\theta)\cos(\omega t)-A\sin(\theta)\sin(\omega t) \quad (\text{eq. 1})$$

Where:
w is the frequency of auxiliary output signal 217,
θ is a phase offset, and
t is time.

Thus, $A\cos(\theta)$ in the first term of eq. 1 may be the I (in-phase) signal and $A\sin(\theta)$ in the second term of eq. 1 may be the Q (quadrature) signal.

Figure 4:
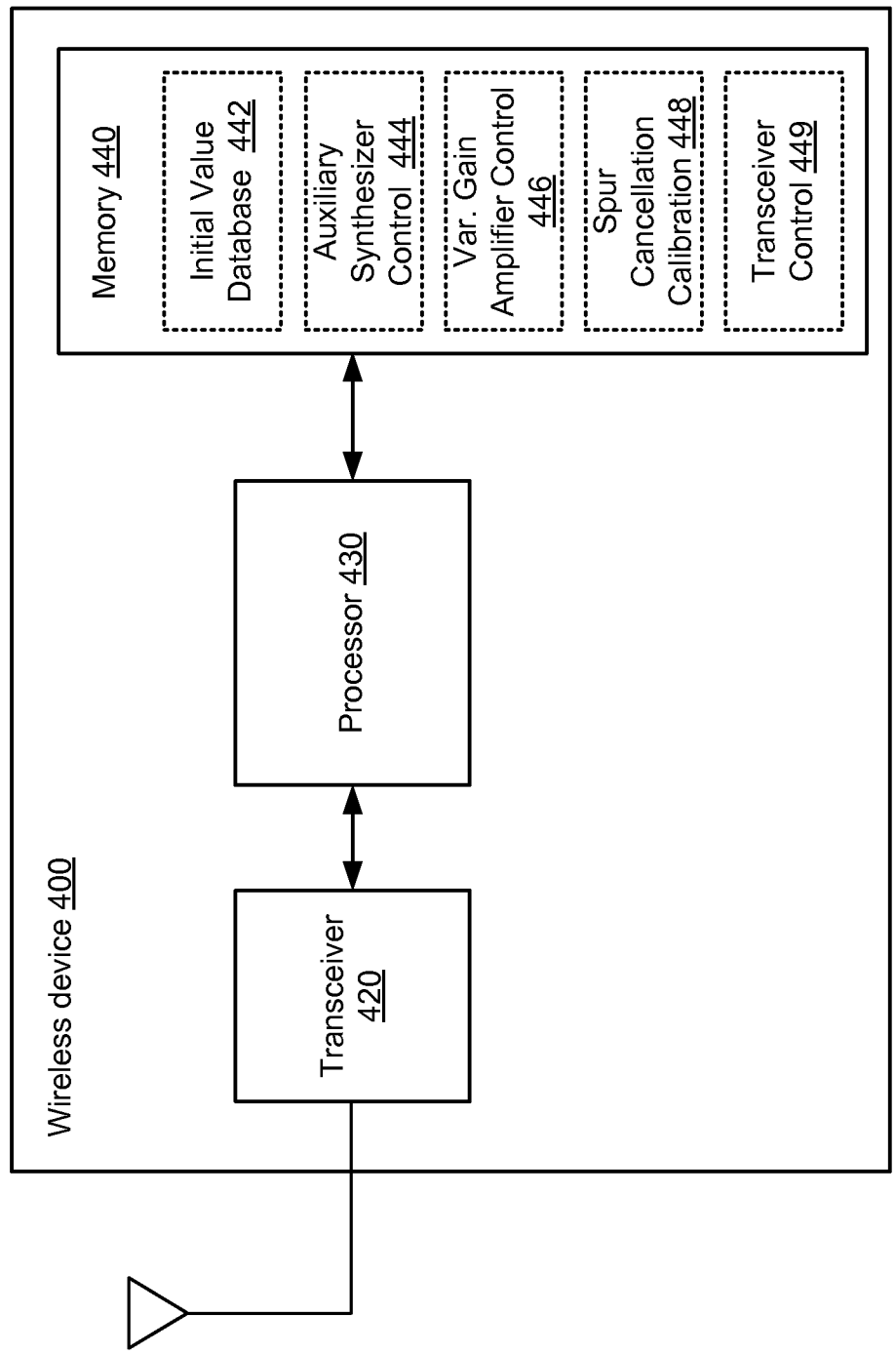
FIG. 4 shows a wireless device that is one embodiment of the wireless devices of FIG. 1.

FIG. 4 shows a wireless device 400 that is one embodiment of the first wireless device 105 and/or second wireless device 115 of FIG. 1. Wireless device 400 includes a transceiver 420, a processor 430, a memory 440, and one or more antennas (only one shown for simplicity). Transceiver 420 may be used to transmit signals to and receive signals from other wireless devices via the one or more antennas.

Memory 440 may include an initial value database 442 that may be used to store one or more initial values for auxiliary synthesizer 216 and/or first variable gain amplifier 224. In some embodiments, wireless device 400 may be characterized through bench tests, computer simulations or the like. These characterizations may be used to determine initial settings for auxiliary synthesizer 216 and/or first variable gain amplifier 224 to generate a spur cancellation signal to mitigate the frequency spur. The initial settings may be stored within initial value database 442.

Memory 440 may also include a non-transitory computer-readable storage medium (e.g., one or more nonvolatile memory elements, such as EPROM, EEPROM, Flash memory, a hard drive, etc.) that may store the following software modules:

- an auxiliary synthesizer control module 444 to control auxiliary synthesizer 216 to generate an auxiliary clock signal and/or a spur cancellation signal;
- a variable gain amplifier control module 446 to control first variable gain amplifier 224;
- a spur cancellation calibration module 448 to determine settings for auxiliary synthesizer 216 and/or first variable gain amplifier 224, for example, to cancel the frequency spur; and
- a transceiver control module 449 to control transceiver 420.

Each software module includes program instructions that, when executed by processor 430, may cause the wireless device 400 to perform the corresponding function(s). Thus, the non-transitory computer-readable storage medium of memory 440 may include instructions for performing all or a portion of the operations of FIG. 5.

Processor 430, which is coupled to transceiver 420, and memory 440, may include one or more suitable processors capable of executing scripts or instructions of one or more software programs stored in the wireless device 400 (e.g., within memory 440).

Processor 430 may execute auxiliary synthesizer control module 444 to cause auxiliary synthesizer 216 to generate the auxiliary clock signal or the spur cancellation signal. For example, when transceiver 420 is receiving a communication signal, executing auxiliary synthesizer control module 444 may cause auxiliary synthesizer 216 to generate the auxiliary clock signal to allow receiver 204 to demodulate the received communication signal. Alternatively, when transceiver 420 is transmitting a communication signal, executing auxiliary synthesizer control module 444 may cause auxiliary synthesizer 216 to generate a spur cancellation signal. In some embodiments, initial values to configure auxiliary synthesizer 216 may be stored within initial value database 442.

Processor 430 may execute variable gain amplifier control module 446 to configure first variable gain amplifier 224. For example, executing variable gain amplifier control module 446 may cause first transconductance amplifier 302 and second transconductance amplifier 304 to provide I (in-phase) and Q (quadrature) signals to first summing node 210, for example, to mitigate a frequency spur. In some embodiments, initial values to configure first variable gain amplifier 224 may be stored within initial value database 442.

Processor 430 may execute spur cancellation calibration module 448 to analyze an output signal (e.g., loopback signal 270) via receiver 204 and determine settings for auxiliary synthesizer 216, first variable gain amplifier 224, second variable gain amplifier 226, and coupler 228 to mitigate a frequency spur. For example, executing spur cancellation calibration module 448 may cause amplifier 212 to provide amplifier output signal 269 that may be coupled via coupler 228 to receiver 204. Receiver 204 may analyze loopback signal 270 to determine if any frequency spurs are present. In some embodiments, receiver 204 may determine whether a magnitude of a frequency spur is greater than a threshold.

Processor 430 may execute transceiver control module 449 to transmit and receive communication signals via transmitter 202 and receiver 204, respectively. For example, executing transceiver control module 449 may cause transmitter 202 to generate a transmitter output signal and cause receiver 204 to analyze loopback signal 270 for frequency spurs.

Figure 5:
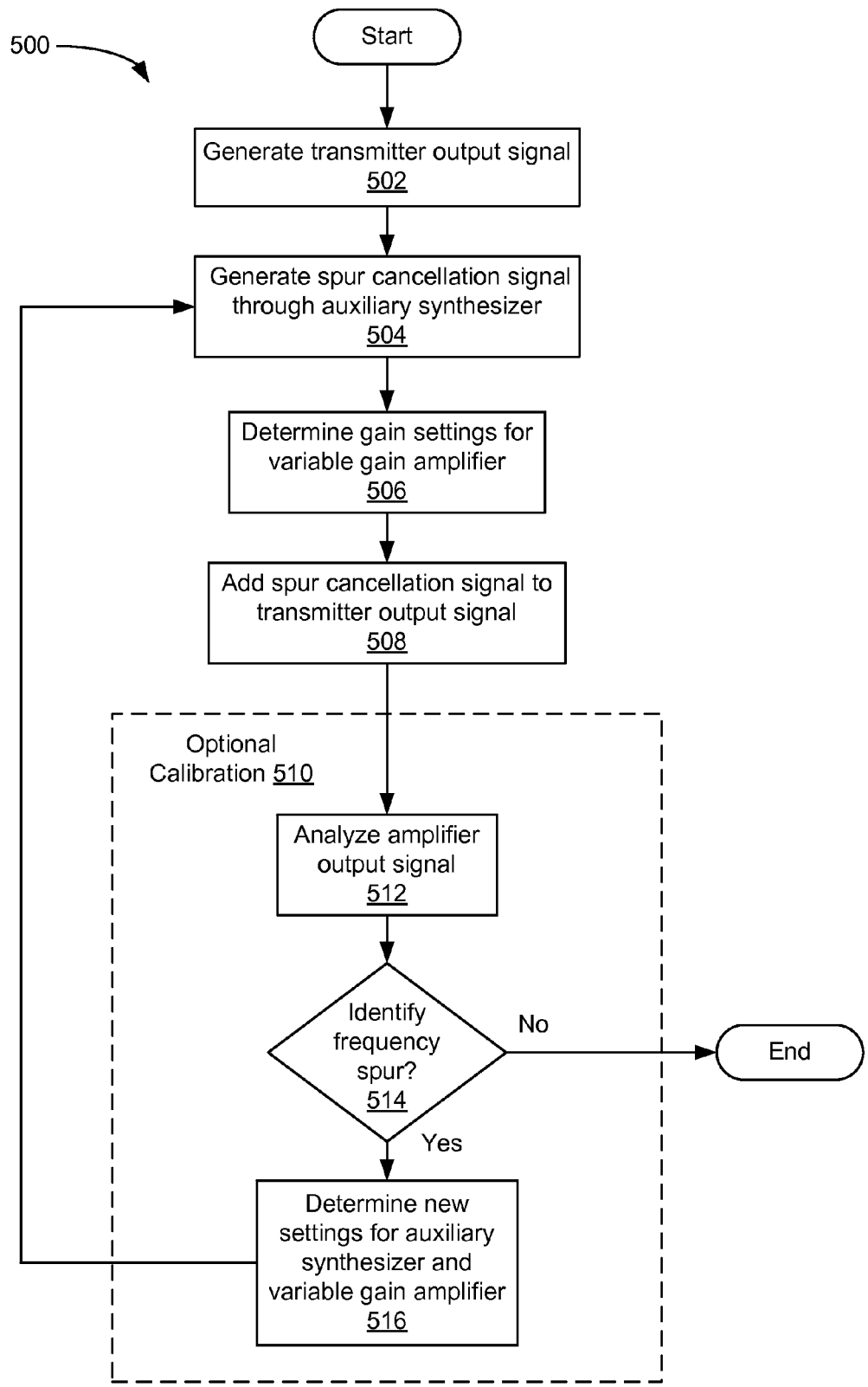
FIG. 5 shows an illustrative flow chart depicting an exemplary operation for operating a wireless device, in accordance with some embodiments.

FIG. 5 shows an illustrative flow chart depicting an exemplary operation 500 for operating a first wireless device, in accordance with some embodiments. Referring also to FIGS. 1 and 2, a transmitter output signal is generated (502). For example, transmitter 202 may generate a transmitter output signal to communicate with a second wireless device. In some embodiments, an undesired frequency spur may be included with the transmitter output signal. Next, a spur cancellation signal is generated by auxiliary synthesizer 216 (504). The spur cancellation signal may be used to mitigate the frequency spur. In some embodiments, the frequency spur may have been characterized during earlier bench tests. Therefore, initial values and/or settings to configure auxiliary synthesizer 216 to generate the spur cancellation signal (e.g., generate auxiliary output signal 217 having characteristics to cancel the frequency spur) may be stored in initial value database 442. Thereafter, the stored values and/or settings may be retrieved, and used to configure auxiliary synthesizer 216.

Next, gain settings for a variable gain amplifier are determined (506). As described above for auxiliary synthesizer 216, initial gain settings for first variable gain amplifier 224 may be determined during bench tests, and stored in initial value database 442. The gain settings may be retrieved, and used to configure the first variable gain amplifier 224. In some embodiments, first variable gain amplifier 224 may be configured to provide I (in-phase) and Q (quadrature phase) signals to cancel a frequency spur included within the transmitter output signal.

Next, cancelling signal 225 is added to the transmitter output signal 203 (508). For example, cancelling signal 225, provided by the first variable gain amplifier 224, may be added to the transmitter output signal 203 to mitigate the frequency spur. In some embodiments, cancelling signal 225 may be added to the transmitter output signal 203 via a summing node.

Next, an optional calibration operation may be performed (510). The calibration operation may analyze the transmitter output signal for frequency spurs, or frequency spurs with a magnitude greater than a threshold. In some embodiments, a loopback signal 270, related to the transmitter output signal, may be received and analyzed by receiver 204 (512). For example, receiver 204 may perform an FFT operation on loopback signal 270 to determine whether the transmitter output signal includes any frequency spurs. In some embodiments, the receiver 204 may determine whether loopback signal 270 includes any frequency spurs with a magnitude greater than a threshold.

Next, a frequency spur is identified within loopback signal 270 (514). For example, receiver 204 may identify a frequency spur with a magnitude greater than a threshold. If a frequency spur is identified, and/or the identified frequency spur has a magnitude greater than the threshold, then new settings for auxiliary synthesizer 216 and/or first variable gain amplifier 224 are determined (516). Operations proceed to 504. On the other hand, if no frequency spur is identified, or if a frequency spur is identified, but the frequency spur has a magnitude that is less than a threshold, then the operation ends.

In the foregoing specification, the example embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A transceiver, comprising:
a transmitter to generate a transmitter output signal based, at least in part, on a digital-to-analog converter (DAC) clock signal;
circuitry to generate a spur cancellation signal during a first mode based, at least in part, on the DAC clock signal;
a summing node, coupled to the transmitter and the circuitry, to sum the spur cancellation signal with the transmitter output signal to cancel, at least in part, a frequency spur included with the transmitter output signal; and
a receiver to demodulate a delivery traffic indication message based, at least in part, on an auxiliary clock signal, different from the spur cancellation signal, provided by the circuitry during a second mode.

2. The transceiver of claim 1, wherein the circuitry includes an auxiliary synthesizer to generate the spur cancellation signal.

3. The transceiver of claim 1, further comprising:
a signal generator to generate a mode control signal based, at least in part, on whether the transceiver is to transmit a communication signal.

4. The transceiver of claim 1, wherein the first mode and the second mode are based, at least in part, on a mode control signal.

5. The transceiver of claim 1, further comprising:
an amplifier coupled to an output of the summing node to generate an amplifier output signal; and
a coupler to couple an output of the amplifier to the receiver, wherein the receiver is to analyze the amplifier output signal.

6. The transceiver of claim 5, wherein the receiver is to determine the spur cancellation signal based, at least in part, on the amplifier output signal.

7. The transceiver of claim 1, further comprising:
a variable gain amplifier to couple the circuitry to the summing node.

8. The transceiver of claim 7, wherein the variable gain amplifier comprises:
a first transconductance amplifier to provide, to the summing node, a first current signal based, at least in part, on the spur cancellation signal; and
a second transconductance amplifier to provide, to the summing node, a second current signal based, at least in part, on the spur cancellation signal.

9. A wireless system, comprising:
a first wireless device; and
a second wireless device to transmit and receive wireless communication signals between the first wireless device, the second wireless device comprising:
a transmitter to generate a transmitter output signal based, at least in part, on a digital-to-analog converter (DAC) clock signal;

circuitry to generate a spur cancellation signal during a first mode based, at least in part, on the DAC clock signal;

a summing node, coupled to the transmitter and the circuitry, to sum the spur cancellation signal with the transmitter output signal to cancel, at least in part, a frequency spur included with the transmitter output signal; and a receiver to demodulate a delivery traffic indication message based, at least in part, on an auxiliary clock signal, different from the spur cancellation signal, provided by the circuitry during a second mode.

10. The wireless system of claim 9, wherein the circuitry includes an auxiliary synthesizer to generate the spur cancellation signal.

11. The wireless system of claim 9, wherein the second wireless device further comprises:

a signal generator to generate a mode control signal based, at least in part, on whether the second wireless device is to transmit a communication signal, wherein the first mode and the second mode are based, at least in part, on the mode control signal.

12. The wireless system of claim 9, wherein the second wireless device further comprises:

an amplifier, coupled to an output of the summing node, to generate an amplifier output signal; and a coupler to couple an output of the amplifier to the receiver, wherein the receiver is to analyze the amplifier output signal.

13. The wireless system of claim 12, wherein the receiver is to determine the spur cancellation signal based, at least in part, on the amplifier output signal.

14. The wireless system of claim 9, wherein the second wireless device further comprises a variable gain amplifier to couple the circuitry to the summing node.

15. The wireless system of claim 14, wherein the variable gain amplifier comprises:

a first transconductance amplifier to provide, to the summing node, a first current signal based at least in part on the spur cancellation signal; and a second transconductance amplifier to provide, to the summing node, a second current signal based at least in part on the spur cancellation signal.

16. A method to cancel a frequency spur, the method comprising:

generating, at a transmitter, a transmitter output signal based, at least in part, on a digital-to-analog converter (DAC) clock signal;

generating, at an auxiliary synthesizer, a spur cancellation signal during a first mode based, at least in part, on the DAC clock signal;

summing, at a summing node, the transmitter output signal with the spur cancellation signal to cancel, at least in part, a frequency spur included with the transmitter output signal; and demodulating, by a receiver, a delivery traffic indication message based, at least in part, on an auxiliary clock signal, different from the spur cancellation signal, provided by the auxiliary synthesizer during a second mode.

17. The method of claim 16, further comprising:

generating a mode control signal based, at least in part, on whether the transmitter is to transmit a communication signal, wherein the first mode and the second mode are based, at least in part, on the mode control signal.

18. The method of claim 16, further comprising:

generating an amplifier output signal based, at least in part, on an output from the summing node;

analyzing the amplifier output signal by the receiver; and determining the spur cancellation signal based, at least in part, on the amplifier output signal.

19. The method of claim 16, further comprising:

coupling the auxiliary synthesizer to the summing node via a variable gain amplifier.

20. The method of claim 19, further comprising:

providing a first current signal based, at least in part, on the spur cancellation signal to the summing node; and providing a second current signal based, at least in part, on the spur cancellation signal to the summing node.

21. A non-transitory computer-readable medium storing instructions that, when executed by a processor of a wireless device, causes the wireless device to:

generate, at a transmitter, a transmitter output signal based, at least in part, on a digital-to-analog converter (DAC) clock signal;

generate, at an auxiliary synthesizer, a spur cancellation signal during a first mode based, at least in part, on the DAC clock signal;

sum, at a summing node, the transmitter output signal with the spur cancellation signal to cancel, at least in part, a frequency spur included with the transmitter output signal;

demodulate, by a receiver, a delivery traffic indication message based, at least in part, on an auxiliary clock signal, different from the spur cancellation signal, provided by the auxiliary synthesizer during a second mode.

22. The non-transitory computer-readable medium of claim 21, further comprising instructions to:

generate a mode control signal based, at least in part, on whether the transmitter is to transmit a communication signal, wherein the first mode and the second mode are based, at least in part, on the mode control signal.

* * * * *